United States Patent
Juhl

(10) Patent No.: US 11,079,438 B2
(45) Date of Patent: Aug. 3, 2021

(54) CIRCUITRY FOR MONITORING BATTERY SYSTEMS

(71) Applicant: VOLKSWAGEN AKTIENGESELLSCHAFT, Wolfsburg (DE)

(72) Inventor: Jochen Juhl, Lüdersfeld (DE)

(73) Assignee: VOLKSWAGEN AKTIENGESELLCHAFT, Wolfsburg (DE)

( * ) Notice: Subject to any disclaimer, the term of this patent is extended or adjusted under 35 U.S.C. 154(b) by 19 days.

(21) Appl. No.: 16/502,890

(22) Filed: Jul. 3, 2019

(65) Prior Publication Data

US 2020/0011935 A1 Jan. 9, 2020

(30) Foreign Application Priority Data

Jul. 4, 2018 (DE) ...................... 10 2018 210 966.4

(51) Int. Cl.
*G01R 31/371* (2019.01)
*G01R 31/367* (2019.01)
(Continued)

(52) U.S. Cl.
CPC ......... *G01R 31/371* (2019.01); *G01R 31/367* (2019.01); *H01M 10/425* (2013.01);
(Continued)

(58) Field of Classification Search
None
See application file for complete search history.

(56) References Cited

U.S. PATENT DOCUMENTS

2008/0258253 A1 10/2008 Fey et al.
2009/0316320 A1* 12/2009 Maeda .................... B60R 16/03
361/92
(Continued)

FOREIGN PATENT DOCUMENTS

CN 104065450 A 9/2014
CN 106054868 A 10/2016
(Continued)

OTHER PUBLICATIONS

Office Action for Chinese Patent Application No. 2019105884092, dated Mar. 31, 2021.

*Primary Examiner* — Roy Y Yi
(74) *Attorney, Agent, or Firm* — Pearl Cohen Zedek Latzer Baratz LLP

(57) ABSTRACT

A circuitry for a battery management system of a vehicle for adapting at least one cell information item via at least one battery cell to a communication system of the vehicle, comprising: a first processing element for generating a message and a test information item in accordance with a first processing, the message being specific to the cell information; at least one second processing element for generating the same message (in accordance with at least one second processing; a communication system interface (for outputting an output instruction to the communication system, the output instruction being at least partially composed of the message in accordance with the second processing and of the test information, so that the output instruction is specific to the first and second processing.

11 Claims, 1 Drawing Sheet

(51) Int. Cl.
*H01M 10/42* (2006.01)
*B60L 58/10* (2019.01)
*B60K 6/28* (2007.10)

(52) U.S. Cl.
CPC .............. *B60K 6/28* (2013.01); *B60L 58/10* (2019.02); *B60Y 2200/91* (2013.01); *B60Y 2200/92* (2013.01); *H01M 2010/4271* (2013.01); *H01M 2010/4278* (2013.01); *H01M 2220/20* (2013.01)

(56) References Cited

U.S. PATENT DOCUMENTS

| | | |
|---|---|---|
| 2010/0023199 A1 | 1/2010 | Weichenberger et al. |
| 2012/0226965 A1 | 9/2012 | Hammerschmidt et al. |
| 2012/0282500 A1 | 11/2012 | Tzivanopoulos et al. |
| 2013/0346783 A1 | 12/2013 | Weber et al. |
| 2014/0239714 A1 | 8/2014 | Kurokawa |
| 2015/0028879 A1 | 1/2015 | Butzmann |
| 2016/0001801 A1* | 1/2016 | Ruhland ............ G06F 11/165 701/19 |
| 2016/0193973 A1 | 7/2016 | Rupp et al. |
| 2018/0157483 A1 | 6/2018 | Lee et al. |
| 2018/0268918 A1* | 9/2018 | Glancy .................... G11C 7/00 |
| 2019/0120907 A1 | 4/2019 | Kroker |

FOREIGN PATENT DOCUMENTS

| | | |
|---|---|---|
| DE | 10 2009 046 564 A1 | 5/2011 |
| DE | 10 2012 101 747 A1 | 9/2012 |
| DE | 10 2011 082 937 A1 | 3/2013 |
| DE | 10 2016 105 602 A1 | 9/2017 |
| KR | 20110130114 A | 12/2011 |
| WO | WO 2005/036285 A1 | 4/2005 |
| WO | WO 2008/014940 A1 | 2/2008 |
| WO | WO 2012/048929 A1 | 4/2012 |

\* cited by examiner

CIRCUITRY FOR MONITORING BATTERY SYSTEMS

CROSS REFERENCE TO RELATED APPLICATIONS

This patent application is claims priority from German Patent Application No. 10 2018 210 966.4, filed on Jul. 4, 2018, the subject matter of which is incorporated herein by reference.

FIELD OF THE INVENTION

The present invention relates to a circuitry for a battery management system, in particular of a motor vehicle. The present invention also relates to a method for adapting at least one cell information item.

BACKGROUND OF THE INVENTION

It is known from the related art to monitor cells in battery systems. The purpose of this monitoring is, for example, to record temperature values and/or voltage values in each case as cell information for individual cells and to compare them to predefined limit values. This makes it possible to ensure a reliable operation of the battery system.

It is often thereby necessary to adapt the cell information in order to transfer it to a battery management system, for example, and/or to a battery management controller (BMC) and/or to a control unit of a motor vehicle. The cell information is transmitted via a bus system of the motor vehicle, for example, so that it is necessary to integrate the cell information into a data packet that is appropriate for this bus system.

Various control methods are known for implementing a reliable error detection during the transmission. In particular, it is necessary here to adhere to safety standards, such as an ASIL standard (Automotive Safety Integrity Level).

In this connection, circuitries and/or circuitry methods of the species are known from the publications: World Patent Application WO 2012/048929 A1, German Patent Application DE 10 2011 082937 A1, and from the German Patent Application DE 10 2009 046564 A1.

However, it is a disadvantage of the known approaches that an adequate and reliable control entails considerable outlay for technical effort and/or costs.

SUMMARY OF THE INVENTION

It is, therefore, an object of the present invention to at least partially overcome the above-described drawbacks in the monitoring of cells of battery systems. In particular, it is an object of the present invention to provide an improved and/or more cost-effective approach for adapting and/or controlling a cell information item in a battery management system and/or BMC of a vehicle.

The aforementioned objective is achieved by a circuitry, preferably by an electronic device having the features of claim 1 and by a method having the features of claim 9. Other features of the present invention and details pertaining thereto are derived from the respective dependent claims, the description and the drawings. It is thereby self-evident that features and details described in connection with the circuitry of the present invention, also apply in connection with the method of the present invention and, respectively, vice versa, so that the disclosure of the particular inventive aspects will or may always be referred to reciprocally.

The objective is achieved, in particular, by a circuitry, preferably an electronic device. The circuitry may thereby be a part of a system, such as a battery management system, in particular of a vehicle. In this connection, the circuitry includes electronic components, for example, which are advantageously mounted on a printed circuit board in the motor vehicle.

It is also advantageous that the vehicle be in the form of a motor vehicle, particularly a trackless terrain vehicle, for example, a hybrid vehicle, which includes an internal combustion engine and an electric machine for traction. The vehicle may also be in the form of an electric vehicle, preferably having a high-voltage vehicle electrical system and/or an electric motor. In particular, the vehicle may be in the form of a fuel-cell vehicle and/or a passenger vehicle. In specific embodiments of electric vehicles, it is preferred that no combustion engine be provided for the vehicle; driving is then solely by electric power.

In particular, the vehicle features a (rechargeable) battery system having the battery management system and/or the BMC. For example, the battery system may have one or a plurality of (battery) cells which are adapted to be rechargeable. For the cell monitoring, at least one monitoring means, such as a cell controller and/or an ASIC (application-specific integrated circuit) may preferably be located near (and/or for the) individual cells of the battery system. For example, as cell information, the monitoring means may record a cell voltage and/or a cell temperature of the particular cell. For example, a single monitoring means may be utilized for a plurality of cells, or one monitoring means may be utilized per cell. Cell information is transmitted from the particular monitoring means to a battery management system (BMS), for example, via a transmission system, for example, and/or a transmission means, such as a Serial Peripheral Interface (SPI) or a Local Interconnect Network (LIN) interface or in accordance with a Transceiver Physical Layer (TPL) protocol. Moreover, it is possible that the cell information is evaluated by a further device, such as a control unit of the vehicle and/or a BMC. This makes it possible to ensure a reliable operation of the battery system. (In each particular case), the at least one monitoring means may be in the form of a cell controller that communicates with the BMC and/or directly with the rest of the vehicle via the communication system. Thus, the communication system may optionally be designed as a battery CAN bus and be used as a communication path between the (particular) cell controller and the BMC. Via the BMC, a contactor control may also be performed and/or balancing requests sent to the (particular) cell controller, for example.

However, it is possible that the further unit expects a reception of the cell information via a communication system, such as a bus system of the vehicle. For that reason, a conversion (i.e., adaptation) of the cell information may be required that is transmitted via the transmission means, respectively transmission system to the communication system (of the vehicle).

In accordance with the present invention, to adapt at least one cell information item (i.e., an information item pertaining to at least one battery cell) to a communication system, in particular of the vehicle, at least one of the following (electronic) components may be provided:

a first processing element, such as a first integrated circuit and/or microcontroller, to generate a message (in particular, as first data), as well as a test information item in accordance with a first processing, the message being specific to the cell information, preferably including the cell information;

at least (or exactly or at most) one second processing element, such as a second integrated circuit and/or microcontroller, for generating the same message (in particular as second data) in accordance with at least (or exactly) one second processing, so that this message preferably likewise includes the cell information;

a communication system interface, such as an electrical connection or another integrated circuit and/or a microcontroller and/or a transceiver, for outputting an output instruction to the communication system.

It may be provided here that the output instruction be at least partially composed of the message (generated by the second processing element) in accordance with the second processing, as well as in accordance with the test information (in accordance with the first processing), so that the output instruction is specific to the first and second processing. In other words, the output instruction features both data, which arise from the first processing for generating the message, as well as data, which arise from the second processing for generating the same message. Normally, these two messages are the same and merely differ in the case of an error. However, the test information correlates with the first processing, for example, is a function of the message generated in accordance with the first processing. Therefore, an error in the first or second processing may be detected by comparing the test information with the message in accordance with the second processing. Therefore, the advantage is attained that the output instruction is likewise recognized as error-free only when there is an error-free first and second processing. It is, thus, possible that the processing elements perform a mutual monitoring.

Moreover, it may be possible that the cell information includes information about a voltage and/or temperature of a cell of a battery system, in particular of the vehicle. For example, the cell information may be repeatedly recorded during operation of the battery system, to ensure a monitoring thereof. It may thereby be a safety-related monitoring, so that a safety standard must be met when transmitting the cell information via the communication system, for example. Accordingly, it is even necessary that the conversion of the cell information, which is transmitted over the transmission system, into the output instruction for the communication system meet a safety standard. Such a safety standard may be an ASIL standard, for example, so that an ASIL-C compliant or ASIL-D compliant microcontroller topology may be used for the described adaptation of the cell information. To meet the safety standard, it is known, for example, to use relatively complex and/or costly dual-core, multi-core or lockstep microcontrollers. If indicated, it may thereby be provided in accordance with the present invention that, instead, two single-core microcontrollers be used as the first and second processing elements. This makes it possible to reduce costs.

Therefore, it may be possible for the first and/or second processing element to each be designed as a microcontroller, preferably as a single-core microcontroller.

In addition, within the scope of the present invention, it may be provided that the first processing element be designed for generating the test information as a test value for the message on the basis of the message (and/or on the basis of the first data) in accordance with the first processing, so that the test value is also executed for checking the message in accordance with the second processing (respectively of the second data). Thus, in particular, it is possible that the processing elements perform a mutual monitoring because both messages generated by the processing elements are identical, in order that the further part of the output instruction (thus, the message in accordance with the second processing) be recognized as error-free on the basis of the test information of the output instruction. In particular, to control the absence of errors, it may be possible that the test value be compared with other data of the output instruction, in particular of the message in accordance with the second processing. When this comparison yields the same comparative result as a comparison of the test value with the message in accordance with the first processing, the output instruction may be recognized as error-free. Otherwise, it may be provided that the output instruction is rejected.

It may optionally be provided that the output instruction and/or the message be adapted to a transmission via the communication system by the output instruction forming a complete or partial data packet, preferably telegram, for the communication system; if indicated, the data packet also including the test information in order for the communication system and/or at least one communication node (such as a control unit or BMC of the vehicle) to check the correctness of the message in accordance with the second processing and/or the data packet. The data packet may be a CAN bus telegram, for example. Here, CAN stands for Controller Area Network; in the present case, a battery CAN or a specialized CAN or the like being possibly understood. Thus, a reliable transmission, for example, to control units of the vehicle, is possible.

Within the scope of the present invention, it may preferably be provided that, as an interface for a CAN bus system, the communication system interface be designed as the communication system, the data packet being in the form of a telegram of the CAN bus. The communication system interface (or, in short, communication interface) may be also be designed as a CAN transceiver or the like, for example, to render possible a communication via the communication system.

In the case of a circuitry, it is also optionally provided that the first and second processing element be designed to be structurally and/or functionally the same as or similar to integrated circuits, preferably microcontrollers, so that the message is redundantly generated in accordance with the first and second processing. For example, both the first processing element, as well as the second processing element may receive and, respectively, decode the cell information (for example, as a TPL signal), making it possible for an output instruction, such as a CAN instruction, to be generated by this decoded information. A mutual monitoring of the processing elements is hereby possible.

In addition, in the case of the circuitry according to the present invention, it may be possible that one of the processing elements include the communication system interface, and/or that a communication system interface be provided that is structurally separate from the processing elements and is connected to at least one of the processing elements to transmit the output instruction. It is possible, for example, that only the second processing element is more complex than the first processing element, so there may be a further cost saving here.

Furthermore, within the scope of the present invention, it is optionally possible for the first processing element to be connected to the second processing element in order to transfer the test information to the second processing element to integrate the same into the output instruction. For example, the first processing element is directly electrically connected to the second processing element to permit a reliable transmission of the test information. In this instance, it is possible that there is no longer a need that the test information be generated by the second processing element as well. In other words, where appropriate, the test information generated by the first processing may be integrated into the output instruction without further modification. It is thus ensured that the first processing is able to check the second processing.

Moreover, it is optionally provided that the second processing element or the communication system interface be designed to generate the output instruction on the basis of the test information in accordance with the first processing and the message in accordance with the second processing. For example, the communication system interface and/or the second processing element may be programmed to be able to generate a CAN instruction from the message and the test information. This makes it possible to reliably communicate with a control unit of the vehicle, for example.

In addition, within the scope of the present invention, it is possible that both the first processing element and the second processing element are connected to a transmission means in order to receive a signal containing the cell information, in particular for the processing elements, independently of one another, to generate the message on the basis of the cell information. For example, generating the test information (by the first processing) may also require generating the message since the test information may be a function of the generated message. Thus, a higher level of safety is ensured.

Moreover, it is advantageous that a circuitry have a safety mechanism in order to reject the output instruction if, upon checking of the message, an error of at least one of the parts of the output instruction is detected on the basis of the test information. In other words, the message (in accordance with the second processing) and the test information (in accordance with the first processing) are each parts of the output instruction, in particular, the message in accordance with the first processing not being used and/or rejected. Thus, a mutual control may be provided by the processing elements. One of the processing elements and/or the communication system interface and/or another communication node of the communication system, such as a control unit of the vehicle, for example, may reject and/or check the output instruction.

A method for adapting at least one cell information item via at least one battery cell to a communication system of a vehicle is likewise a subject matter of the present invention.

It is provided here that the following steps be implemented, preferably in succession or in any desired sequence:
a) a first processing element generating a message and a test information in accordance with a first processing, the message being specific to the cell information, preferably as a function of the cell information;
b) at least a second processing element generating the same message in accordance with at least a second processing;
c) a communication system interface outputting an output instruction to the communication system, the output instruction being at least partially composed of the message in accordance with the second processing, as well as in accordance with the test information (generated by the first processing element), so that the output message is specific to the first and second processing.

Thus, the method according to the present invention has the same inherent advantages that were described in detail with reference to a circuitry according to the present invention. The method may also be suited for operating a circuitry according to the present invention.

Another option may provide that the first processing include generating the test information as a CRC test value in accordance with a cyclic redundancy check (in short: CRC). An especially high level of reliability may be hereby provided during the error control.

Moreover, it may be provided that the first and/or second processing element and/or the communication system interface be designed in accordance with an inventive circuitry.

BRIEF DESCRIPTION OF THE DRAWINGS

Further advantages, features and details of the present invention are derived from the following description, in which exemplary embodiments of the present invention are explained in detail with reference to the drawing. In each case, the features delineated in the claims and the description may be essential to the present invention, either alone or in any combination. In the drawing:

DETAILED DESCRIPTION OF THE INVENTION

Figure 1:
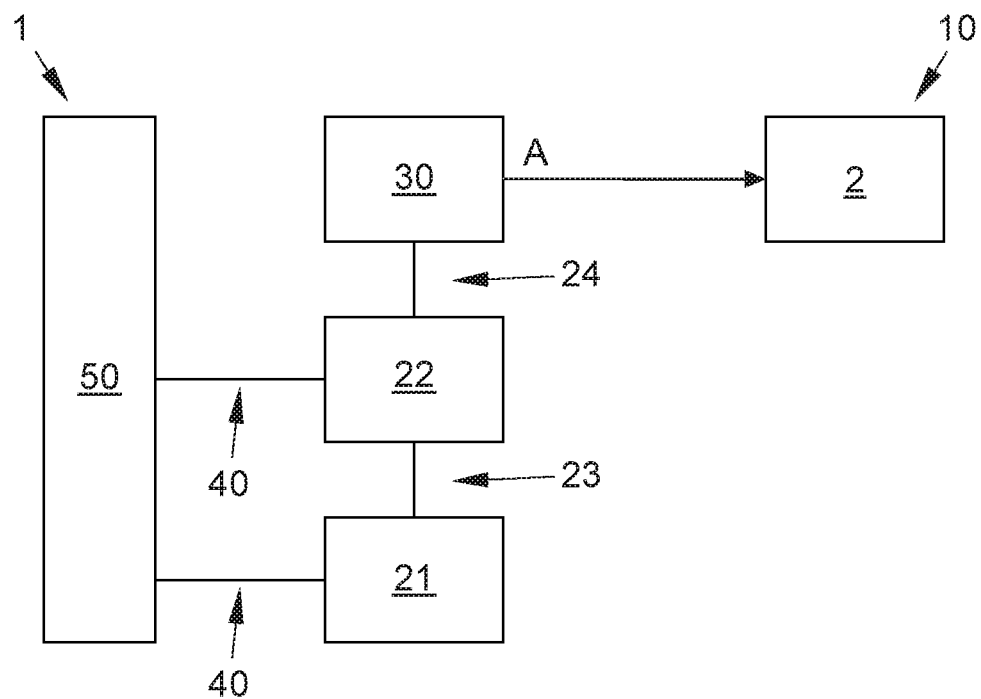
FIG. 1 is a schematic representation of a circuitry according to the present invention.

In the following figures, identical reference numerals are used for the same technical features, even of different exemplary embodiments.

FIG. 1 shows a circuitry 10 according to the present invention for a battery management system 1, for adapting at least one cell information item via at least one battery cell to a communication system 2 of a vehicle 5.

A first processing element 21 may be thereby provided for generating a message 140 and a test information 151 in accordance with a first processing 110, the message 140 being specific to the cell information, in particular to a measured value. In particular, test information 151 may be generated as a function of message 140, for example, on the basis of (data and/or other) contents of message 140 (in other words: test information 151 is generated from message 140). For this purpose, a signal containing the cell information is initially received by a transmission system 50 and, for example, subsequently decoded. Message 140 is generated therefrom. Message 140 thereby produces a CAN instruction, for example, from address information and data contents. Via CRC, for example, the contents of message 140 may be utilized to compute test information 151.

In addition, at least one second processing element 22 may be provided for generating the same message 140 in accordance with a second processing 120.

First and second processing element 21, 22 may be designed to be structurally and/or functionally the same as or similar to integrated circuits, preferably microcontrollers. This makes it possible for message 140 to be redundantly generated in accordance with first and second processing 110, 120.

It is discernible that first processing element 21 is connected to second processing element 22 in order to transfer test information 151 to second processing element 22 to integrate the same into output instruction 150. For example, first processing element 21 is directly connected to second processing element 22 via a first connection means 23, such as a serial interface and/or a UART interface. Here, UART stands for Universal Asynchronous Receiver Transmitter.

Both first processing element 21, as well as second processing element 22 may be connected to a transmitting means 40 in order to receive a signal containing the cell information from a transmission system 50, and, in each case independently of one another, in order to generate message 140 on the basis of the cell information. Transmission system 50 includes, for example, a TPL protocol and/or an SPI interface (here, SPI stands for Serial Peripheral Interface), and is connected, for example, to at least one monitoring means of a particular cell.

Provided, moreover, is a communication system interface 30 that is separate from processing elements 21, 22 or is integrated in one thereof for outputting A an output instruction 150 to communication system 2. Communication system interface 30 is connected directly to second processing element 22, for example, via a second connection means 24, such as a bus system and/or an SPI interface and/or via a battery CAN bus system.

As an interface for a CAN bus system, communication system interface 30 may be designed as communication system 2, data packet 150 being in the form of a telegram 150 of the CAN bus.

Figure 2:
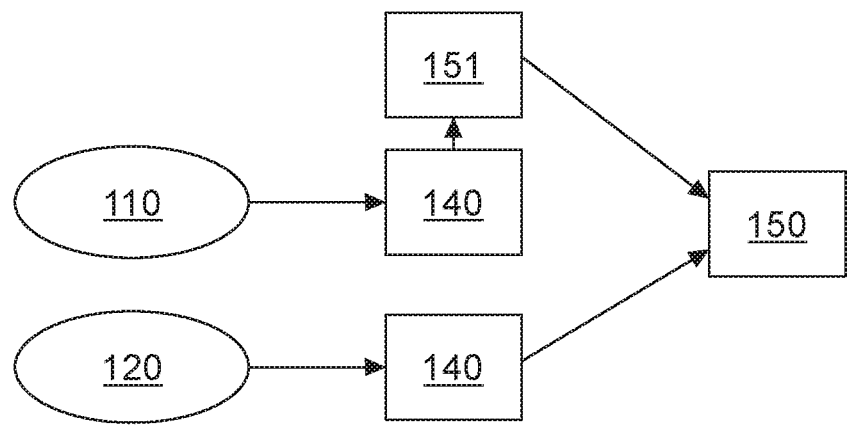
FIG. 2 is a schematic representation for visually representing a method according to the present invention.

As described in greater detail in FIG. 2, to perform the output, output instruction 150 is at least partially composed of message 140 in accordance with second processing 120, as well as of test information 151, so that output instruction 150 is specific to first and second processing 120. It is, thus, possible for processing elements 21, 22 to perform a mutual monitoring of the error-free processing.

In addition, first processing element 21 may be designed for generating test information 151 as a test value for message 140 on the basis of message 140 in accordance with first processing 110, so that the test value is also executed for checking message 140 in accordance with second processing 120.

Moreover, output instruction 150 and/or message 140 may be adapted to a transmission via communication system 2 by output instruction 150 forming a complete or partial data packet 150 for communication system 2. In this case, data packet 150 may also include test information 151 in order for communication system 2 and/or at least one communication node to check the correctness of the message 140 in accordance with second processing 120 and/or data packet 150.

It is advantageous for a safety mechanism to be provided in order to reject output instruction 150 if, upon checking of message 140, an error of at least one of the parts of output instruction 150 is detected on the basis of test information 151.

Moreover, FIG. 2 visually represents a method according to the present invention; initially, a message 140, as well as a test information 151 being generated in accordance with a first processing 110; same message 140 then being generated in accordance with at least a second processing 120; an output instruction 150 subsequently being output to communication system 2. In this case, output instruction 150 may be at least partially composed of message 140 in accordance with second processing 120, as well as of test information 151, so that output instruction 150 is specific to first and second processing 120.

Figure 3:
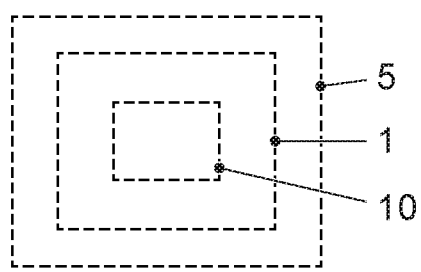
FIG. 3 is a schematic representation of a system having the circuitry according to the present invention.

FIG. 3 schematically illustrates that circuitry 10 according to the present invention may be part of a battery management system 1 of a vehicle 5.

In the above explanation of the specific embodiments, the present invention is only described with reference to examples. To the extent that they are technically practical, it is self-evident that individual features of the specific embodiments may be freely combined with one another without departing from the scope of the present invention.

REFERENCE NUMERAL LIST 1 system, battery management system
2 communication system
5 vehicle
10 circuitry
21 first processing element
22 second processing element
23 first connection means
24 second connection means
30 communication system interface
40 transmission means
50 transmission system
110 first processing
120 second processing
140 message
150 output instruction, data packet, telegram
151 test information
A output

The invention claimed is:

1. A circuitry for a battery management system of a vehicle for adapting at least one cell information item via at least one battery cell to a communication system of the vehicle, the circuitry comprising:
a first processor configured to:
generate a first message in accordance with a first processing of cell information,
generate a test information item from the first message; and
at least one second processor configured to:
redundantly generate a second message from the cell information in accordance with at least one second processing,
receive the test information from the first processor, and
generate an output instruction to the communication system, the output instruction being at least partially composed of the second message in accordance with the second processing and of the test information generated by the first processor, so that the output instruction is specific to the first and second processing.

2. A circuitry for a battery management system of a vehicle for adapting at least one cell information item via at least one battery cell to a communication system of the vehicle, the circuitry comprising:
a first processing element for generating a message and a test information item in accordance with a first processing, the message being specific to the cell information;
at least one second processing element for generating the same message in accordance with at least one second processing, wherein the first processing element is designed for generating the test information as a test value for the message on the basis of the message in accordance with the first processing, so that the test value is also executed for checking the message in accordance with the second processing; and
a communication system interface for outputting an output instruction to the communication system, the output instruction being at least partially composed of the message in accordance with the second processing and of the test information, so that the output instruction is specific to the first and second processing.

3. The circuitry as recited in claim 1, wherein the output instruction, the first message and/or the second message are/is adapted to a transmission via the communication system by the output instruction forming a complete or partial data packet for the communication system, the data packet also including the test information in order for the communication system and/or the at least one communication node to check the correctness of the message in accordance with the second processing and/or the data packet.

4. The circuitry as recited claim 1, wherein, as an interface for a CAN bus system, the communication system interface is designed as the communication system, the data packet being in the form of a telegram of the CAN bus.

5. The circuitry as recited in claim 1, wherein the first and second processors are designed to be structurally and/or functionally the same as or similar to integrated circuits, so that the message is redundantly generated in accordance with the first and second processing.

6. The circuitry as recited in claim 5, wherein the integrated circuits are microcontrollers.

7. The circuitry as recited in claim 1, wherein the first processor is connected to the second processor in order to transfer the test information to the second processor to integrate the test information into the output instruction.

8. The circuitry as recited in claim 1, wherein both the first processor and the second processor are connected to a transmitting means in order to receive a signal containing the cell information for the processors, independently of one another, to generate the message (on the basis of the cell information.

9. The circuitry as recited in claim 1, further comprising a safety mechanism to reject the output instruction if, upon checking of the message, an error of at least one of the parts of the output instruction is detected on the basis of the test information.

10. A method for adapting at least one cell information item via at least one battery cell to a communication system of a vehicle, the method comprising following steps:
generating, by a first processing element, a message and a test information item in accordance with a first processing, the message being specific to the cell information;
generating, by at least a second processing element, the same message in accordance with at least a second processing;
outputting, by a communication system interface, an output instruction to the communication system, the output instruction being at least partially composed of the message in accordance with the second processing and of the test information, so that the output instruction is specific to the first and second processing.

11. The method as recited in claim 10, wherein the first processing includes generating the test information as a CRC test value in accordance with a cyclic redundancy check.

\* \* \* \* \*